(12) United States Patent
Väinölä et al.

(10) Patent No.: US 12,413,145 B2
(45) Date of Patent: Sep. 9, 2025

(54) FILTER CAPACITANCE ESTIMATION BY RESONANCE FREQUENCY DETERMINATION

(71) Applicant: ABB Schweiz AG, Baden (CH)

(72) Inventors: Vili Väinölä, Espoo (FI); Jarno Kukkola, Helsinki (FI)

(73) Assignee: ABB Schweiz AG, Baden (CH)

( * ) Notice: Subject to any disclaimer, the term of this patent is extended or adjusted under 35 U.S.C. 154(b) by 232 days.

(21) Appl. No.: 18/480,066

(22) Filed: Oct. 3, 2023

(65) Prior Publication Data
US 2024/0128863 A1 Apr. 18, 2024

(30) Foreign Application Priority Data
Oct. 6, 2022 (EP) .................. 22200134

(51) Int. Cl.
*H02M 3/158* (2006.01)
*H02M 1/00* (2006.01)
(Continued)

(52) U.S. Cl.
CPC ......... *H02M 3/015* (2021.05); *H02M 1/0025* (2021.05); *H02M 1/126* (2013.01); *H02M 3/158* (2013.01)

(58) Field of Classification Search
CPC .... H02M 3/015; H02M 1/0025; H02M 1/126; H02M 3/158
See application file for complete search history.

(56) References Cited

U.S. PATENT DOCUMENTS 3,970,925 A 7/1976 Procter
5,568,042 A 10/1996 Nyberg

2013/0266102 A1* 10/2013 Yan ............ H04B 1/1081
375/350

FOREIGN PATENT DOCUMENTS

EP 3096429 A1 11/2016
EP 3232217 A1 10/2017
(Continued)

OTHER PUBLICATIONS

Pirsto, Ville, et al. "Real-time identification of LCL filters employed with grid converters." IEEE Transactions on Industry Applications 56.5 (2020): 5158-5169.
(Continued)

*Primary Examiner* — Adolf D Berhane
(74) *Attorney, Agent, or Firm* — McCarter & English, LLP

(57) ABSTRACT

Described herein is a method of estimating a quantity dependent on a capacitance ($C_f$) of an electrical filter connected to an AC side of an electrical converter. The method includes injecting a plurality of frequency components into a voltage reference of the electrical converter; operating the electrical converter with the voltage reference by determining switching commands from the voltage reference and applying the switching commands to the electrical converter; determining an AC side voltage ($u_c$) and an AC side current ($i_c$) in the AC side of the electrical converter and determining a filter admittance and/or filter impedance from the AC side voltage ($u_c$) and the AC side current ($i_c$); determining at least one of a resonance frequency and an anti-resonance frequency of the electrical filter; and determining the quantity dependent on the capacitance ($C_f$) of the electrical filter from the resonance frequency and/or the anti-resonance frequency.

15 Claims, 4 Drawing Sheets

(51) Int. Cl.
*H02M 1/12* (2006.01)
*H02M 3/00* (2006.01)

(56) References Cited

FOREIGN PATENT DOCUMENTS

| | | |
|---|---|---|
| EP | 3242383 A1 | 11/2017 |
| EP | 2814150 B1 | 3/2020 |
| FR | 2576690 A1 | 8/1986 |

OTHER PUBLICATIONS

Athikessavan, Subash Chandar, et al. "Diagnosis and prognosis of LCL filter in marine electric propulsion systems." 2019 IEEE 13th International Conference on Power Electronics and Drive Systems (PEDS). IEEE, 2019.

Makdessi, Maawad, et al. "Accelerated ageing of metallized film capacitors under high ripple currents combined with a DC voltage." IEEE Transactions on Power Electronics 30.5 (2014): 2435-2444.

\* cited by examiner

FILTER CAPACITANCE ESTIMATION BY RESONANCE FREQUENCY DETERMINATION

CROSS-REFERENCE TO RELATED APPLICATIONS

This application claims priority to European Patent Application No. 22200134.9, filed Oct. 6, 2022, and titled "FILTER CAPACITANCE ESTIMATION BY RESONANCE FREQUENCY DETERMINATION", which is hereby incorporated by reference in its entirety.

BACKGROUND

The present disclosure relates to a method, a computer program, a computer-readable medium and a controller for estimating a quantity dependent on a capacitance of an electrical filter and for estimating a degradation of the capacitance of the electrical filter. The present disclosure also relates to an electrical converter system.

Electrical converter systems usually have an electrical filter, which is connected between the electrical AC terminals of an electrical converter and the electrical grid supplying the converter system with electrical energy. Such electrical filters include capacitors, which degrade over time. At a certain degradation state, the capacitors should be replaced before they fail completely.

Therefore, the degradation state of such capacitors is regularly checked by manual measurements. For the check, a service technician has to be at the site of the converter system and operation of the converter system may have to be stopped.

BRIEF DESCRIPTION

The present disclosure provides a method for estimating the capacitance of an electrical filter in an easy to implement way, which can be performed automatically and without the need for stopping a regular operation of the converter system.

A first aspect of the present disclosure relates to a method for estimating a quantity dependent on a capacitance of an electrical filter. The electrical filter may be a passive filter and/or may be composed of inductors, capacitors and optionally resistors. The capacitance of the electrical filter may be provided by one or more capacitors. The quantity dependent on the capacitance may be the capacitance or may have a functional relationship to the capacitance. In particular, the quantity dependent on the filter capacitance may be proportional to the filter capacitance.

The electrical filter is connected to an AC side of an electrical converter. An electrical converter is adapted for converting an AC current into a DC current or a further AC current, and/or vice versa. The electrical filter may be connected between an electrical AC grid and the electrical converter.

The electrical converter and the electrical filter may have a single phase or multiple phases, such as three phases.

According to an embodiment of the present disclosure, the method includes: injecting a plurality of frequency components into a voltage reference of the electrical converter, where the frequency components have frequencies in a frequency range, and where at least one of a resonance frequency and an anti-resonance frequency of the electrical filter is expected.

Each frequency component may be a sinusoidal signal. It is possible that the frequency components are provided by a step function or sequence of step functions. The amplitude of the injected frequency components may be much lower than an amplitude of the original and/or pre-injection voltage reference, such as at least 10 to 200 times lower.

The plurality of frequency components may be injected at the same time or one after the other. Injection may mean that the frequency components are added to an original voltage reference, which is then modified into a further voltage reference, which is used for modulating the electrical converter.

For determining the quantity dependent on the capacitance of the electrical filter, the resonance frequency and/or the anti-resonance frequency of the filter is used (see below). There may be a predefined range of frequencies, where these frequencies are to be expected. Furthermore, the frequency range may be set based on previous passes of the method. The frequency range may be scanned with the frequency components for determining the resonance frequency and/or the anti-resonance frequency.

According to an embodiment of the present disclosure, the method further includes: operating the electrical converter with the voltage reference by determining switching commands from the voltage reference and applying the switching commands to the electrical converter. The voltage reference of the electrical converter may be provided by a controller of the electrical converter, which tries to follow a further reference such as current, power, another voltage, flux or torque reference. The voltage reference is used for modulating the electrical converter. From the voltage reference, switching commands for the electrical converter may be determined, for example via pulse width modulation.

According to an embodiment of the present disclosure, the method further includes: determining an AC side voltage and an AC side current in the AC side of the electrical converter and determining therefrom a filter admittance and/or filter impedance. The AC side current may be measured between the electrical converter and the electrical filter. The AC side voltage may be received from a modulator of the electrical converter, which generates switching signals for the electrical converter. Each of the AC side voltage and/or the AC side current may be a single phase or multi-phase quantity. For further method steps, the AC side voltage and the AC side current may be transformed into a complex coordinate system, such as the $\alpha\beta$ or xy reference frame. The filter admittance may be the AC side current divided by the AC side voltage. The filter impedance is the inverse of the filter admittance.

According to an embodiment of the present disclosure, the method further includes: determining at least one of a resonance frequency and an anti-resonance frequency of the electrical filter by determining a frequency, where a phase angle of the filter admittance and/or filter impedance switches between a negative value and a positive value. An (anti-) resonance frequency may be a frequency, where the magnitude of the electrical filter admittance has a positive (negative) peak and/or where a phase angle of the filter admittance and/or filter impedance changes sign from a positive (negative) value to a negative (positive) value.

According to an embodiment of the present disclosure, the method further includes: determining the quantity dependent on the capacitance of the electrical filter from the resonance frequency and/or the anti-resonance frequency. The electrical filter may be described with mathematical formulas derived from the electrical properties of its components. These mathematical formulas interrelate the resonance frequency and/or the anti-resonance frequency with the capacitance. The capacitance may be determined by inputting the resonance frequency and/or the anti-resonance frequency into these mathematical formulas. The mathematical formulas also may depend on further known and/or estimated quantities, such as one or more inductances and/or one or more resistances of the electrical filter.

The quantity dependent on the capacitance of the electrical filter determined in this way may be compared with a nominal quantity and/or capacitance and a warning message may be issued, when the difference becomes higher than a threshold.

With the method, the quantity dependent on the capacitance of the electrical filter can be determined without the need for additional hardware components and without the need for a manual interference of a service technician.

According to an embodiment of the present disclosure, the method further includes: operating the electrical converter in a normal operation mode, where the electrical converter converts a current to be supplied to a load and/or to the grid. The plurality of frequency components may be injected into the voltage reference by adding the plurality of frequency components to the voltage reference, which is provided by a controller of the electrical converter controlling the energy flow. In other words, the controller determines an original voltage reference, which is controlled, such that a further reference, such as a current, power, another voltage, flux or torque reference is followed, and the plurality of frequency components are added to the original voltage reference, such that a modified voltage reference is generated, which is then used for modulating the electrical converter.

In particular, when the amplitude of the injected frequency components is much smaller, such as at least 10 times smaller, as an amplitude of the voltage reference, the method may be performed during the normal operation mode of the electrical converter. Normal operation may mean that the electrical converter is supplying a load and/or the grid with electrical power. In such a way, the capacitance estimation may be performed without stopping a normal operation of the electrical converter. The capacitance estimation may be performed regularly during normal operation of the electrical converter.

According to an embodiment of the present disclosure, the method further includes: filtering the determined AC side voltage and the determined AC side current, such that solely frequencies of the injected frequency components remain in the AC side voltage and the AC side current. It has to be noted that in this context, the AC side voltage and the AC side current are signals measured and/or calculated from other quantities. The filtering may be done in a digital way by transforming the AC side voltage and/or the AC side current into the frequency domain and discarding other frequencies as the ones of the frequency components.

According to an embodiment of the present disclosure, the method further includes: determining the filter admittance and/or filter impedance from the filtered AC side voltage and the filtered AC side current.

In the case when solely a sinusoidal frequency component with one specific frequency is injected into the voltage reference at one time, solely the AC side voltage and the AC side current of this specific frequency may be determined. The amplitude and phase angle of the admittance and/or filter impedance at the specific frequency may be determined.

According to an embodiment of the present disclosure, the method further includes: scanning the filter admittance and/or filter impedance by injecting the plurality of frequency components one after the other. This may mean that at one time point, solely one frequency component, such as a sinusoidal frequency component, is injected into the voltage reference. At any time point, a specific frequency component with a specific frequency is injected, the determined AC side voltage and the determined AC side current are filtered with respect to the specific frequency and a phase angle of the filter admittance and/or filter impedance at the specific frequency is determined from the filtered AC side voltage and the AC side current. From the phase angles associated with the frequencies of the frequency components it is determined where the phase angle of the filter admittance and/or filter impedance switches between the negative value and the positive value. For example, this may be done by interpolating between the phase angle/frequency points.

According to an embodiment of the present disclosure, in a first step during scanning, two border frequencies are determined, where the phase angle of the filter admittance and/or filter impedance is negative and positive. The scanning may start at an arbitrary frequency and the frequency may be increased (decreased) until the phase angle changes sign. In such a way, a frequency range (defined by the border frequencies) may be determined, which surely contains the frequency with the phase angle sign change.

According to an embodiment of the present disclosure, in a second step during scanning, a binary search is performed between the two border frequencies by iteratively injecting a frequency component with a frequency having the average of the two border frequencies and setting one of the border frequencies to the average frequency, where the filter admittance and/or filter impedance at the average frequency has the same phase angle as the respective border frequency. The iterations may be done until the width of the border frequencies is smaller than a threshold.

According to an embodiment of the present disclosure, the AC side voltage and the AC side current are multi-phase quantities, such as three-phase quantities. The AC side voltage and the AC side current may be transformed into a complex valued reference frame before they are filtered. Each of the AC side voltage and the AC side current may have three phases, each of which may be measured independently. In the context of three-wire three-phase systems, two of three components of AC side voltage and/or the AC side current may have enough information for determining mathematically equivalent complex-valued signals in the $\alpha\beta$, dq or xy reference frame. Therefore, all three current components and voltage components may not be needed. The third component may be calculated from the two others. The complex valued signal may be seen as a mapping from those two voltage or current components.

The filtering and/or the determination of the phase angle may be performed in another reference frame, such as in the $\alpha\beta$, dq or xy reference frame.

According to an embodiment of the present disclosure, the filter capacitance is determined from the resonance frequency and/or the anti-resonance frequency and a known inductance of the electrical filter. For an LCL filter or an LC filter, the filter capacitance can be determined with formulas (2), (3) or (4) below.

According to an embodiment of the present disclosure, the electrical filter is connected between the AC side of the electrical converter and an electrical grid. In this case, the inductance of the electrical grid may need to be estimated. The grid inductance of the electrical grid may be determined from the resonance frequency and the anti-resonance frequency, such as in formula (2) below. The filter capacitance may be determined based on the grid inductance, such as in formula (3) below.

According to an embodiment of the present disclosure, the electrical converter is a three-phase converter and the electrical filter is a three-phase filter. As already mentioned, the method may be applied to single-phase and multi-phase systems. In the case of a three-phase system, the capacitors of the electrical filter may be star-connected or delta-connected.

According to an embodiment of the present disclosure, the electrical filter is an LCL filter with, for each phase, two inductors connected in series to the AC side of the electrical converter and a capacitor connected to a midpoint between the two inductors. The capacitors of different phases may be star- or delta-connected. The two inductors may be interconnected between the electrical converter and an electrical grid.

It also may be that the electrical filter is an LC filter with, for each phase, an inductor and a capacitor connected in series to the AC side of the electrical converter.

In general, when the filter is an LCL filter, the quantity dependent on the filter capacitance may be determined from the resonance frequency and anti-resonance frequency. When the filter is an LC filter, the quantity dependent on the filter capacitance may be determined from the resonance frequency alone.

When both the converter-side and grid-side inductances are known, the quantity dependent on the filter capacitance may be determined from the resonance frequency or anti-resonance frequency alone. For example, the converter-side and grid-side inductances may be measured or estimated with a separate method.

A further aspect of the present disclosure relates to a method for estimating a degradation of a capacitance of an electrical filter. Degradation of the capacitance may be determined by estimating the capacitance of the electrical filter several times and comparing the values. For example, the capacitance may be estimated every day.

The method may include: estimating the quantity dependent on the capacitance of the electrical filter by regularly performing the method such as described above and below; and generating a time series of quantities dependent on the capacitances and estimating the capacitor degradation from the time series. With such a time series, a time point in the future can be determined, where the capacitance falls below a threshold value, when the capacitors of the electrical filter needs to be exchanged.

Further aspects of the present disclosure relate to a computer program for estimating a capacitance of an electrical filter, which, when being executed by a processor, is adapted to carry out the steps of the method as described above and below, and to a computer-readable medium, in which such a computer program is stored. A computer-readable medium may be a hard disk, an USB (Universal Serial Bus) storage device, a RAM (Random Access Memory), a ROM (Read Only Memory), an EPROM (Erasable Programmable Read Only Memory) or a FLASH memory. A computer-readable medium may also be a data communication network, e.g., the Internet, which allows downloading a program code. In general, the computer-readable medium may be a non-transitory or transitory medium.

A further aspect of the present disclosure relates to a controller for estimating a capacitance of an electrical filter, which controller is adapted for performing the method as described above and below. For example, the controller may include a memory, in which a computer program is stored, which, when executed on a processor of the controller, performs the method.

A further aspect of the present disclosure relates to a converter system, which includes an electrical converter with semiconductor switches adapted for converting an AC side current into a DC current; an electrical filter for filtering the AC side current; and a controller for controlling the semiconductor switches of the electrical converter and for performing the method such as described above and below. The method may be implemented as a software module into the controller of the electrical converter.

It has to be understood that features of the method as described in the above and in the following may be features of the converter system as described above and below, and vice versa.

These and other aspects of the present disclosure will be apparent from and elucidated with reference to the embodiments described hereinafter.

BRIEF DESCRIPTION OF THE DRAWINGS

The present disclosure will be explained in more detail in the following text with reference to exemplary embodiments which are illustrated in the attached drawings.

In principle, identical parts are provided with the same reference symbols in the figures.

DETAILED DESCRIPTION

Figure 1:
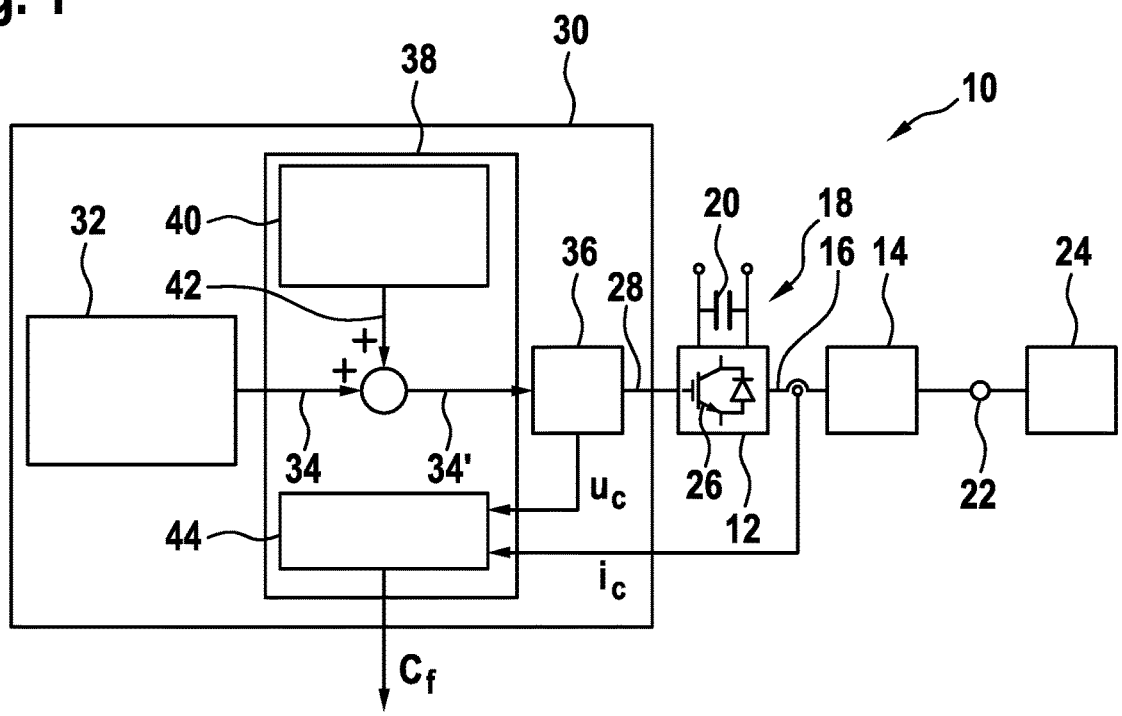
FIG. 1 schematically shows a block diagram of a converter system according to an embodiment of the present disclosure.

FIG. 1 shows a converter system 10 including an electrical converter 12 and an electrical filter 14. The electrical filter 14 is connected via an AC side 16 with the converter 12. The converter 12 may include a DC side 18, which is connected with a DC link 20 that, for example, may be connected to a further converter, which supplies a load, such as an electrical motor. On the other side, the electrical filter 14 is connected at the point of common coupling, PCC 22 to an electrical grid 24.

The semiconductor switches 26 of the electrical converter 12 are controlled via switching signals 28 from a controller 30 of the converter system 10. A controller 32 generates a voltage reference 34, for example, such that a current reference to be drawn from or supplied to the electrical grid 24 is followed or such that an energy demand of a load or an energy obtained from a source is transferred through the electrical converter 12 in a controlled manner. A possibly modified voltage reference 34' (see below) is supplied to a modulator 36, which for example via pulse width modulation generates the switching signals 28. The switching signals 28 are applied to the electrical converter 12, which generates a converter voltage $u_c$ and a converter current $i_c$ at its AC side 16.

When the capacitance $C_f$ of the electrical filter 14 should be estimated, a capacitance estimator 38 generates specific frequency components 42 with an exciter 40, which frequency components 42 are injected into and/or added to the voltage reference 34 to generate the modified voltage reference 34'.

An evaluator 44 of the capacitance estimator 38 receives the converter voltage $u_c$, which is generated at the AC side 16. The converter voltage $u_c$ may be provided by the modulator 36 or may be measured at the AC side 16. For example, the converter voltage $u_c$ may be equal to the voltage reference 34'. The evaluator 44 further receives the converter current $i_c$, which also may be measured at the AC side 16. Based on this data, the evaluator 44 then estimates the capacitance $C_f$ of the electrical filter 14. It has to be noted that the converter voltage $u_c$ and the converter current $i_c$ are signals (for example analogue or digital), which indicate the magnitude of the corresponding real quantities in the converter system 10.

Figure 2:
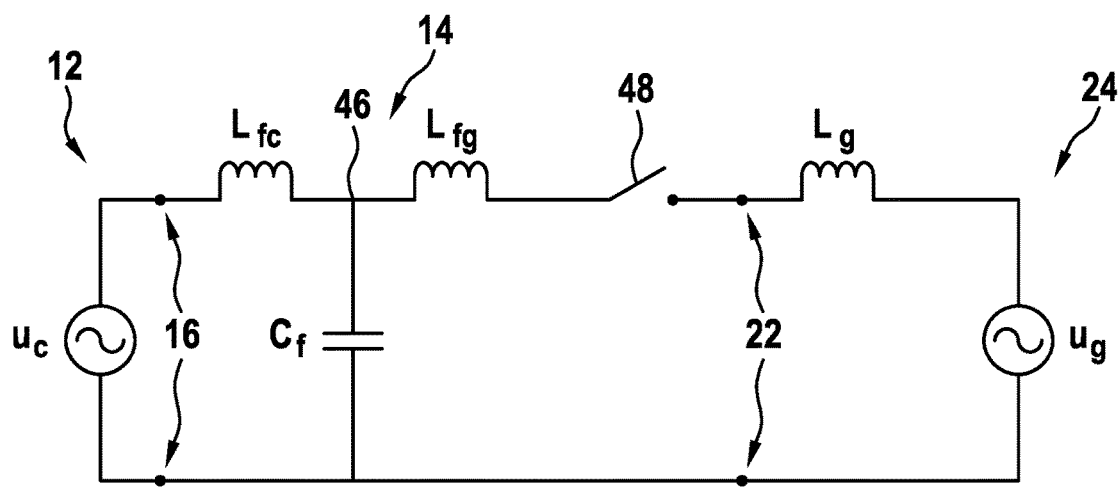
FIG. 2 schematically shows a circuit diagram of the electrical filter and the electrical grid of FIG. 1.

FIG. 2 schematically shows a circuit diagram of the electrical filter 14 and the electrical grid 24 of FIG. 1. The electrical filter 14 is an LCL filter, which includes a converter-side inductor with the inductance of $L_{fc}$ and a grid-side inductor with the inductance of $L_{fg}$, which are connected in series between the converter 12 and the electrical grid 24. A filter capacitor with capacitance $C_f$ is connected to a midpoint 46 between the two inductors $L_{fc}$ and $L_{fg}$.

It has to be understood that the filter capacitor with capacitance $C_f$ may be realized as several hardware capacitors connected in parallel and/or in series.

The electrical grid 24 is modelled as a voltage source $u_g$ and a grid inductance $L_g$.

In the case of a multi-phase system, FIG. 2 shows equivalent single-line diagram of the electrical filter 14 and the grid 24 and the filter capacitors of the phases with the capacitance $C_f$ may be star-connected or delta-connected.

The converter system 10 also may include a circuit breaker 48, which is connected between the electrical filter 14 and the electrical grid 24. When the circuit breaker 48 is open, the electrical filter 14 is effectively an LC filter composed of the converter-side inductor $L_{fc}$ and the filter capacitor $C_f$.

The estimation of the filter capacitance $C_f$ as described herein is based on searching the anti-resonance and/or resonance frequencies of the filter admittance. It is also possible to search these frequencies with the aid of the filter impedance, which is the inverse of the filter admittance.

Figure 3:
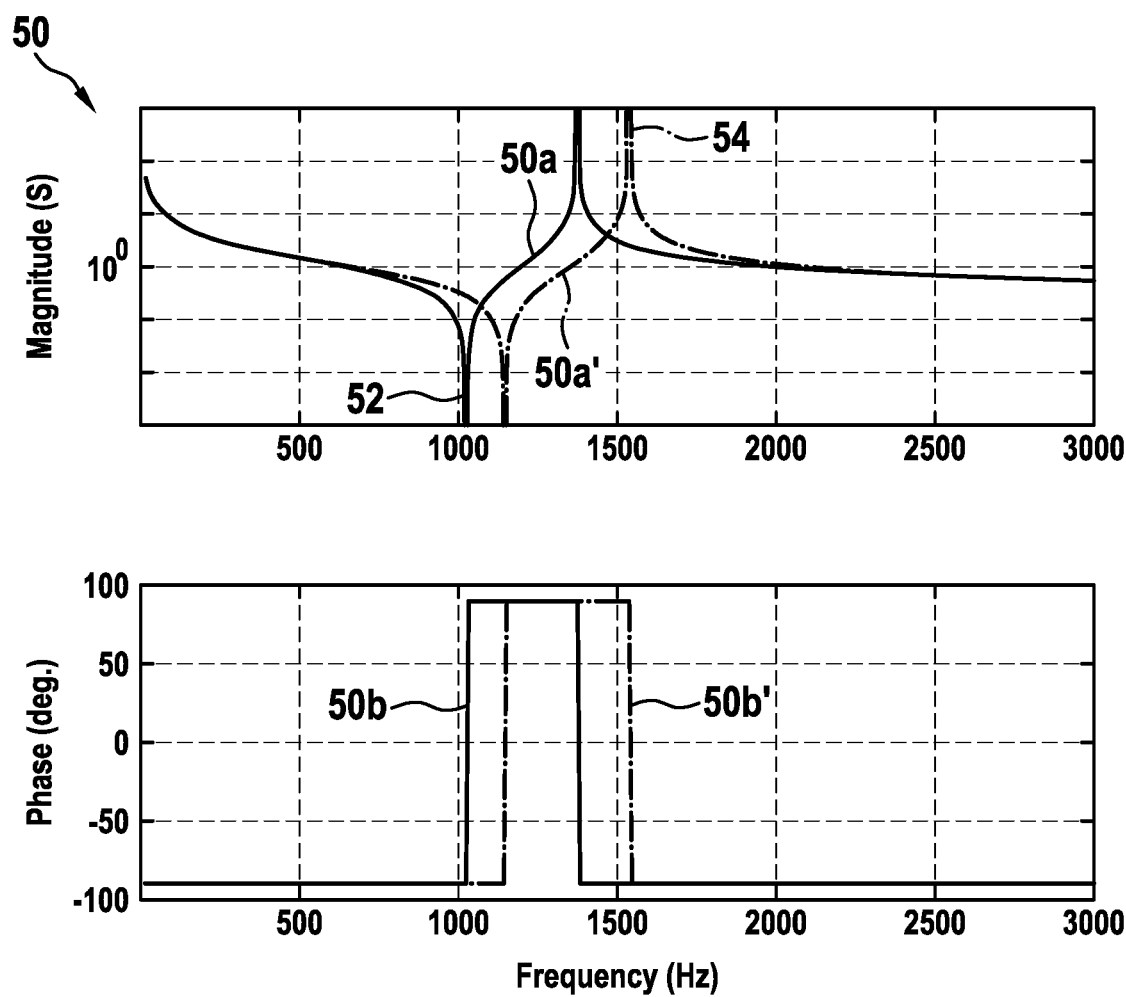
FIG. 3 shows a diagram with the frequency response of the admittance of an LCL filter.
Figure 4:
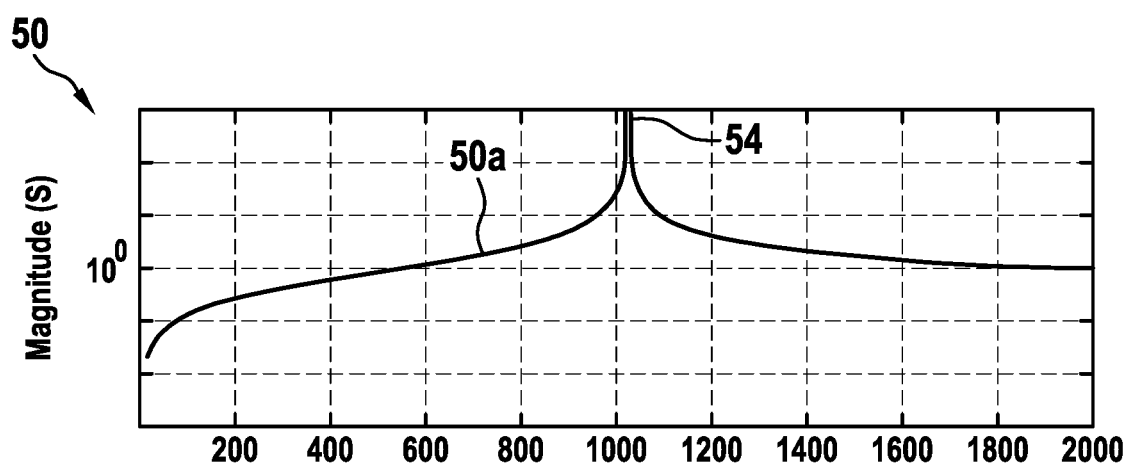
FIG. 4 shows a diagram with the frequency response of the admittance of an LC filter.
Figure 4:
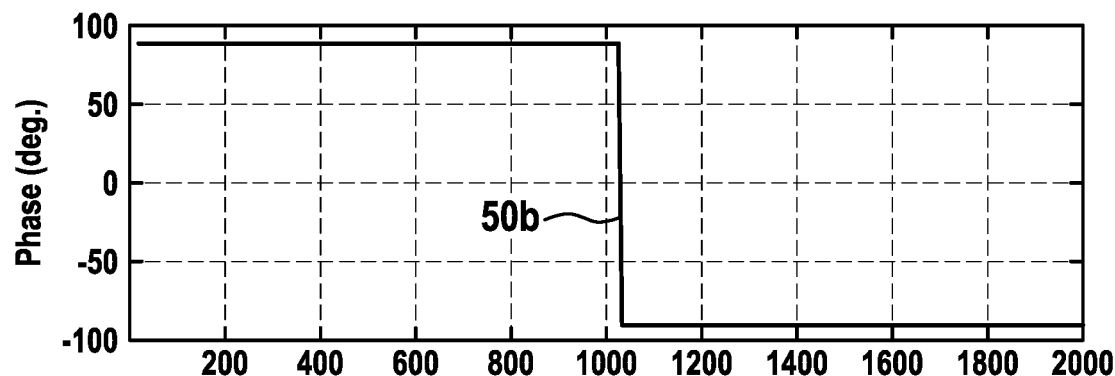

Such admittances 50 are shown in FIGS. 3 and 4. In particular, FIG. 3 shows the magnitude 50a and the phase angle 50b of an ideal/lossless LCL filter admittance as seen from the converter AC side/AC terminals. FIG. 3 also shows the magnitude 50a' and the phase angle 50b' of the admittance of the same LCL filter with filter capacitance $C_f$, which is degraded by 20%. FIG. 4 shows the magnitude 50a and the phase angle 50b of an ideal/lossless LC filter admittance as seen from the converter terminals. As can be seen, the admittance 50 of an LCL filter has an anti-resonance frequency 52 and a resonance frequency 54. The admittance 50 of an LC filter solely has a resonance frequency 54.

At the anti-resonance frequency 52, the magnitude 50a has a negative peak and the phase angle 50b shifts from $-90°$ to $+90°$. At the resonance frequency 54, the magnitude 50a has a positive peak and the phase angle 50b shifts from $+90°$ to $-90°$. In the case of a real filter, there are some losses, e.g., due to parasitic series resistances, and the phase shift does not start from $-90°$ but from a bit less negative value and stops to bit smaller positive value than $90°$. However, a zero crossing also exists in the case of a real filter.

For example, the transfer function of admittance of an ideal LCL-filter is $$Y(s) = \frac{i_c}{u_c} = \frac{s^2 + \omega_z^2}{L_{fc}s(s^2 + \omega_p^2)} \quad (1)$$

where $i_c$ is the converter current and $u_c$ the converter voltage. $\omega_z =$ $$\omega_z = \sqrt{\frac{1}{(L_{fg} + L_g)C_f}}$$

is the anti-resonance frequency 52 and $$\omega_p = \sqrt{\frac{L_{fc} + L_{fg} + L_g}{L_{fc}(L_{fg} + L_g)C_f}}$$

is the resonance frequency 54. When the capacitance $C_f$ decreases, the resonance frequencies 52, 54 of the admittance 50 change as shown in FIG. 4.

When the resonance frequencies $\omega_z$ and $\omega_p$ are known, the total grid side inductance $L_t = L_{fg} + L_g$ and filter capacitance $C_f$ can be calculated $$L_t = L_{fg} + L_g = L_{fc}\left(\frac{\omega_p^2}{\omega_z^2} - 1\right) \quad (2)$$

$$C_f = \frac{1}{L_g\omega_z^2} \quad (3)$$

because the converter side inductance $L_{fc}$ is known and does not change as the capacitance $C_f$. The grid side inductance $L_{fg}$ of the LCL filter can in general be included into total grid-side inductance $L_t$ with the grid inductance $L_g$, which is not known and may change over time.

In the case of an LC filter, the capacitance $C_f$ can be calculated from the resonance frequency $$\omega_p = \sqrt{\frac{1}{L_{fc}C_f}}$$

as $$C_f = \frac{1}{L_{fc}\omega_p^2} \quad (4)$$

In general, a quantity proportional to the capacitance $C_f$ may be determined in this way, when instead of the inductances, values proportional to the inductances, which solely need to have the correct mutual relationships, are used.

Figure 5:
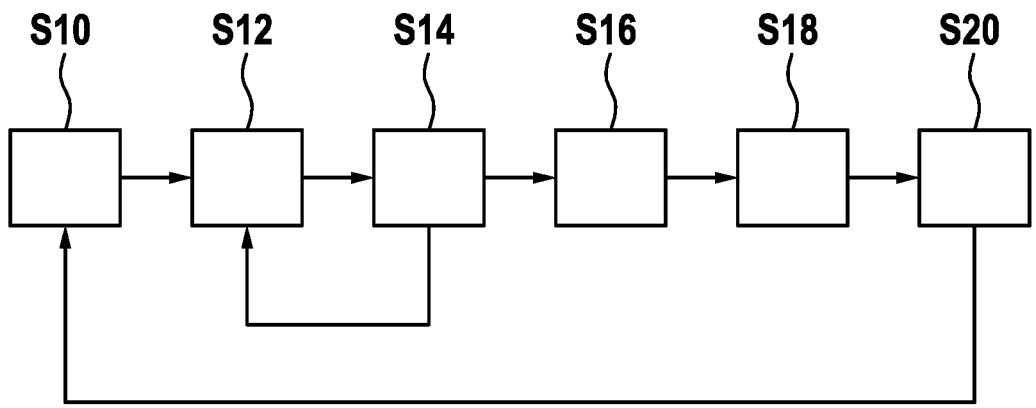
FIG. 5 shows a flow diagram for a method for estimating a capacitance of an electrical filter according to an embodiment of the present disclosure.

FIG. 5 shows a flow diagram for a method for estimating the capacitance $C_f$ of the electrical filter 14 and for optionally estimating a degradation of the capacitance $C_f$ over time. The general idea is to find resonance frequencies by inspecting the phase of the admittance 50, where the zero-crossings of the phase angle correspond to the resonance frequencies. The method uses the phase information instead of magnitude information so that it is not sensitive to the magnitude of the peaks of the resonances.

In step S10, the electrical converter 12 is operated in a normal mode, where, for example, the electrical converter 12 converts a power to be supplied to a load. The electrical converter 12 is switched with the voltage reference 34 by determining switching commands 28 from the voltage reference 34, 34' and applying the switching commands 28 to the electrical converter 12. The controller 32 generates the voltage reference 34, which is supplied to the modulator 36. The modulator 36 generates the switching signals 28, which are supplied to the electrical converter 12, which, for example, are determined via pulse width modulation.

During the following steps, the controller 32 and the modulator 36 keep performing their tasks, however, the voltage reference 34 is modified into the voltage reference 34'. In such a way, the normal operation of the electrical converter 12 may be maintained.

It also may be that the voltage reference 34 is set to zero and that the voltage reference 34' equals the frequency components 42.

In the following steps S12 and S14, phase angles of the admittance 50 or of the corresponding impedance at different frequencies are determined. The two steps may be repeated until enough phase angles in dependence of the frequencies of the admittance 50 or impedance have been acquired. Such phase angles are shown in FIGS. 3 and 4 with the curves 50b.

In step S12, one or more frequency components 42 are injected by the exciter 40 into the voltage reference 34 of the electrical converter 12 to generate the voltage reference 34'. It may be that the voltage reference 34 is set to zero and that the voltage reference 34' equals the frequency components 42.

It also may be that the one or more frequency components 42 are added to the voltage reference 34. In this case, the amplitude of the one or more frequency components 42 may be much smaller than the amplitude of the voltage reference 34. In such a way, the one or more frequency components 42 do not disturb the normal operation of the electrical converter 12.

It may be that solely one sinusoidal frequency component 42 with a specific frequency is injected into the voltage reference 34 at one time. In this case, steps S12 to S14 have to be repeated for every phase angle to be acquired.

It also may be that several sinusoidal frequency components 42 with several specific frequencies are injected into the voltage reference 34 at one time. In general, a wideband signal may provide the frequency components 42 to reduce the injection time.

In general, the frequency components 42 may have frequencies in a frequency range, where at least one of a resonance frequency 54 and an anti-resonance frequency 52 of the electrical filter 14 is expected. This range may be pre-set in the controller resonance frequency 54 and an anti-resonance frequency 52.

In step S14, an AC side voltage $u_c$ and an AC side current $i_c$ in the AC side 16 of the electrical converter 12 are measured and/or calculated and received by the evaluator 44. The evaluator 44 filters the AC side voltage $u_c$ and the AC side current $i_c$, such that solely frequencies of the frequency components 42 remain in the measured AC side current $i_c$.

For example, when solely a specific frequency component 42 with a specific frequency is injected, the AC side voltage $u_c$ and the AC side current $i_c$ are filtered with respect to the specific frequency. For a multi sinus signal, solely these frequencies are left in the AC side voltage $u_c$ and the AC side current $i_c$. For a broadband signal, solely a frequency range of the broadband signal may be left in the AC side voltage $u_c$ and the AC side current $i_c$.

For a frequency component 42 with a specific frequency, the AC side voltage $u_c$ and the AC side current $i_c$, which are in the xy-frame, may be sampled and then transformed into a dq-frame rotating at the specific frequency. After that, the dq-frame signals of the AC side voltage $u_c$ and the AC side current $i_c$ may then be filtered to remove the other frequencies different from the specific frequency.

In general, the AC side voltage $u_c$ and the AC side current $i_c$ may be multi-phase quantities and the AC side voltage $u_c$ and the AC side current $i_c$ may be transformed into a complex valued reference frame before they are filtered.

A phase angle of the admittance at the specific frequency is determined from the filtered AC side voltage $u_c$ and filtered AC side current $i_c$. The admittance 50 for a frequency may then be calculated using the dq-frame signals as $$y = \frac{i_c}{u_c}$$

and the phase angle 50b for the frequency can be extracted from the complex number y.

As already mentioned, steps S12 and S14 are repeated until enough phase angles in dependence of the frequencies are collected to determine a resonance frequency 54 and/or an anti-resonance frequency 52 of the admittance 50.

For example, the admittance 50 may be scanned by injecting sinusoidal frequency components 42 one after the other in a specific way.

In a first step during scanning, two border frequencies may be determined, where the phase angle 50b of the admittance 50 is negative for the one border frequency and positive for the other border frequency.

For example, for an LCL filter, in the first step, firstly a frequency is searched, where the phase angle 50b of the admittance 50 is positive. This may be done by injecting some frequency that is close, such as for example 1000 Hz. If the phase angle is negative, continue by injecting a lower frequency.

If a positive phase angle 50b is not found by lowering the frequency, the search is continued by injecting higher frequencies than the starting frequency. A frequency where the phase angle 50b is positive should be found below some limit frequency such as 2000 Hz, but if it is not, the capacitance estimation may be stopped.

Once a frequency is known, where the phase angle 50b is positive, a lower frequency is injected until the admittance 50 has a negative phase angle 50b. It is then known that the resonance frequency 54 is above the frequency where the phase angle is negative (lower border frequency) and below where the phase angle is positive (upper border frequency).

Upper and lower border frequencies for the resonance frequency 54 may be found in an analogue way, but now the injected frequency is increased from a frequency with a positive phase angle 50b until the phase angle 50b is negative.

In a second step during scanning, a binary search may be performed between the two border frequencies by iteratively injecting a frequency component 42 with a frequency having the average of the two border frequencies and setting one of the border frequencies to the average frequency, where the admittance 50 at the average frequency has the same phase angle as the respective border frequency.

In the second step, a frequency at the midpoint and/or average of the upper border frequency and the lower border frequency is injected. If the phase angle 50b of the admittance 50 is negative, the lower border frequency is adjusted to this frequency. If the phase angle 50b is positive, the upper border frequency is adjusted. This may be continued until the phase angle 50b is close enough to zero (for example less than) 5° and/or the lower border frequency and the upper lower border frequency are close to each other (for example have a difference of less than 10 Hz).

Figure 6:
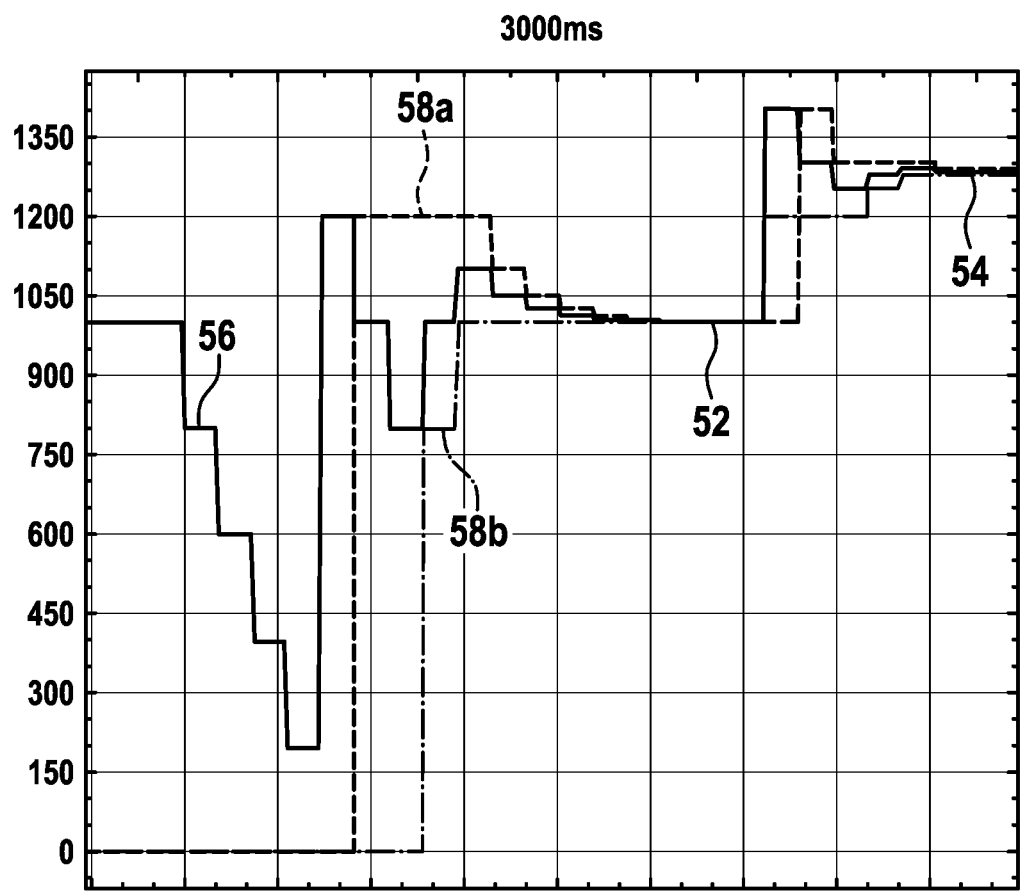
FIG. 6 shows a diagram with frequency injections over time done in the method of FIG. 5.

As an example, FIG. 6 shows a diagram with frequency injections over time performed by the method of FIG. 5 with binary search. The injected frequency is depicted from bottom to top. Time is depicted from left to right. It can be seen that the capacitance estimation lasts about 3 seconds.

FIG. 6 shows the actual injected frequency 56, i.e., solely one sinusoidal frequency component 42 is injected at any time. Additionally, an actual upper border frequency 58a for the resonance or anti-resonance frequency and an actual lower border frequency 58b for the resonance or anti-resonance frequency are shown.

In FIG. 6, the search during the first step initially fails to find a frequency which has a positive phase angle 50b by trying a lower frequency. The method then tries a higher frequency than the first one tried, which has a positive phase angle 50b and the upper border frequency 58a is set to that value. The method then continues to find the lower border frequency 58b for the anti-resonance frequency 52. After finding lower and upper border frequencies 58a. 58b of the anti-resonance frequency 52, the midpoint between the two border frequencies 58a, 58b is tried until the phase angle 50b of the admittance 50 is close enough to zero and/or the lower and upper border frequencies 58a, 58b are close enough to each other.

The search for the resonance frequency 54 is done similarly, but initially the old upper border frequency 58a is set as the lower border frequency 58b. The upper border frequency 58a of the resonance frequency 54 is then searched after which the midpoint between the border frequencies 58a, 58b is tried until the phase angle 50b of the admittance 50 at that frequency is close enough to zero and/or the lower and upper border frequencies 58a, 58b are close enough to each other.

Returning to FIG. 5, in step S16, the evaluator 44 determines at least one of a resonance frequency 54 and an anti-resonance frequency 52 of the electrical filter 14 by determining a frequency, where a phase angle 50b of the admittance switches between a negative value and a positive value. In particular, from the phase angles 50b associated with the frequencies of the frequency components 42 it is determined where the phase angle 50b of the admittance 50 switches between a negative value and a positive value, i.e., has a zero-crossing.

As an example, the phase angles 50b, which have been collected during steps S12 and S14, may be interpolated and the zero-crossings of the corresponding graph may be found.

As a further example, during the binary search described above, small frequency intervals are found, which contain the zero-crossings. The resonance frequency 54 and/or the anti-resonance frequency 52 may be set to the midpoint of the corresponding intervals.

In step S18, the evaluator 44 determines the capacitance $C_f$ of the electrical filter 14 from the resonance frequency 54 and/or the anti-resonance frequency 52.

For an LCL filter this may be done with formulas (2) and (3): The filter capacitance $C_f$ is determined from the resonance frequency 54 and the anti-resonance frequency 52 and the known inductance $L_{fc}$ of the electrical filter 14. The total grid-side inductance $L_t$ of the electrical grid 24 is determined from the resonance frequency 54 and the anti-resonance frequency 52 with (2) and the filter capacitance $C_f$ is determined based on the total grid-side inductance $L_t$ with (3).

The estimate for the total grid-side inductance $L_t$ is a side product of the method and may be used for other purposes. When the grid-side inductance $L_{fg}$ of the LCL filter is a priori known, the grid inductance $L_g$ can be separated from the total inductance $L_t$ as $L_g = L_t - L_{fg}$.

If the method is performed, while the main circuit breaker opens, the electrical filter 14 can be seen as an LC-filter and the filter capacitance $C_f$ can be estimated from the resonance frequency 54 alone by using formula (4).

The steps S10 to S18 may be repeated regularly, for example every hour, every day or every week, and the capacitance $C_f$ of the electrical filter 14 may be determined.

In step S20, the evaluator 44 generates a time series of capacitances $C_f$ and estimates the capacitor degradation from the time series. For example, the degradation may be fitted to an exponential decay. The capacitor degradation may be a value indicating the speed of the reduction of the capacitance $C_f$ of electrical filter 14. A time may be determined when the capacitors of the electrical filter 14 have to be exchanged.

While the present disclosure has been illustrated and described in detail in the drawings and foregoing description, such illustration and description are to be considered illustrative or exemplary and not restrictive; the present disclosure is not limited to the disclosed embodiments. Other variations to the disclosed embodiments can be understood and effected by those skilled in the art and practising the claimed configurations, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A method of estimating a quantity dependent on a capacitance ($C_f$) of an electrical filter connected to an AC side of an electrical converter, the method comprising:

injecting a plurality of frequency components into a voltage reference of the electrical converter, wherein the frequency components have frequencies in a frequency range where at least one of a resonance frequency and an anti-resonance frequency of the electrical filter is expected;

operating the electrical converter with the voltage reference by determining switching commands from the voltage reference and applying the switching commands to the electrical converter;

determining an AC side voltage ($u_c$) and an AC side current ($i_c$) in the AC side of the electrical converter and determining a filter admittance and/or filter impedance from the AC side voltage ($u_c$) and the AC side current ($i_c$) in the AC side of the electrical converter;

determining at least one of a resonance frequency and an anti-resonance frequency of the electrical filter by determining a frequency where a phase angle of the filter admittance and/or filter impedance switches between a negative value and a positive value; and determining the quantity dependent on the capacitance ($C_f$) of the electrical filter from the resonance frequency and/or the anti-resonance frequency.

2. The method of claim 1, further comprising:

operating the electrical converter in a normal mode where the electrical converter converts a current to be supplied to a load and/or to an electrical grid,
 wherein the plurality of frequency components are injected into the voltage reference by adding the plurality of frequency components to the voltage reference, which is provided by a controller of the electrical converter controlling the supply to the load and/or to the electrical grid.

3. The method of claim 1, further comprising:

filtering the AC side voltage ($u_c$) and the AC side current ($i_c$), such that solely frequencies of the frequency components remain in the AC side voltage ($u_c$) and the AC side current ($i_c$); and determining the filter admittance and/or filter impedance from the filtered AC side voltage ($u_c$) and the filtered AC side current ($i_c$).

4. The method of claim 1, further comprising:

scanning the filter admittance and/or filter impedance by injecting the plurality of frequency components one after the other,
 wherein at any time a specific frequency component with a specific frequency is injected, the AC side voltage ($u_c$) and the AC side current ($i_c$), are filtered with respect to the specific frequency,
 wherein a phase angle of the specific frequency component is determined from the AC side voltage ($u_c$) and the AC side current ($i_c$), and
 wherein from the phase angles, which are associated with the frequencies of the frequency components, it is determined where the phase angle of the filter admittance and/or filter impedance switches between the negative value and the positive value.

5. The method of claim 4, wherein in a first step during the scanning, two border frequencies are determined where the phase angle of the filter admittance and/or filter impedance corresponding to one of the two border frequencies is negative and where the phase angle of the filter admittance and/or filter impedance corresponding to the other of the two border frequencies is positive, and wherein in a second step during the scanning, a binary search is performed between the two border frequencies by iteratively injecting a frequency component with a frequency having an average of the two border frequencies and setting one of the border frequencies to the average frequency where the filter admittance and/or filter impedance at the average frequency has the same phase angle as the respective border frequency.

6. The method of claim 1, wherein the AC side voltage ($u_c$) and the AC side current ($i_c$) are multi-phase quantities, and wherein the AC side voltage ($u_c$) and the AC side current ($i_c$) are transformed into a complex valued reference frame before the AC side voltage ($u_c$) and the AC side current ($i_c$) are filtered.

7. The method of claim 1, wherein the quantity dependent on the capacitance ($C_f$) of the electrical filter is determined from the resonance frequency and/or the anti-resonance frequency and a known inductance ($L_{fc}$) of the electrical filter, and/or wherein the quantity dependent on the capacitance ($C_f$) of the electrical filter is proportional to the capacitance ($C_f$).

8. The method of claim 1, wherein the electrical filter is connected between the AC side of the electrical converter and an electrical grid, and wherein a total grid-side inductance ($L_t$) of the electrical grid is determined from the resonance frequency and the anti-resonance frequency and the quantity dependent on the capacitance ($C_f$) of the electrical filter is determined based on the total grid-side inductance ($L_t$).

9. The method of claim 1, wherein the electrical converter is a three-phase converter and the electrical filter is a three-phase filter, and/or wherein capacitors of the electrical filter are star-connected or delta-connected.

10. The method of claim 1, wherein the electrical filter is an LCL filter with two inductors ($L_{fc}$, $L_{fg}$) connected in series to the AC side of the electrical converter and a capacitor ($C_f$) connected to a midpoint between the two inductors.

11. A method for estimating a degradation of a capacitance ($C_f$) of an electrical filter, the method comprising:

estimating a quantity dependent on the capacitance ($C_f$) of the electrical filter by regularly performing the method of claim 1; and generating a time series of quantities dependent on the capacitances ($C_f$) and estimating the degradation of the capacitance ($C_f$) from the time series.

12. A computer program for estimating a quantity dependent on a capacitance ($C_f$) of an electrical filter, which, when executed by a processor, is adapted to carry out the steps of the method of claim 1.

13. A computer-readable medium, in which a computer program according to claim 12 is stored.

14. A controller for estimating a quantity dependent on a capacitance ($C_f$) of an electrical filter, the controller adapted for performing the method of claim 1.

15. An electrical converter system, comprising:

an electrical converter with semiconductor switches adapted for converting an AC side current ($i_c$) into a DC current;

an electrical filter for filtering the AC side current ($i_c$); and a controller for controlling the semiconductor switches of the electrical converter and for performing the method of claim 1.

* * * * *